United States Patent [19]

Tamura

[11] Patent Number: 5,691,717
[45] Date of Patent: Nov. 25, 1997

[54] DATABASE RECORD COMPRESSION SYSTEM AND METHOD THEREFOR INCLUDING FIRST AND SECOND DICTIONARIES

[75] Inventor: Minoru Tamura, Tokyo, Japan

[73] Assignee: NEC Corporation, Tokyo, Japan

[21] Appl. No.: 577,215

[22] Filed: Dec. 22, 1995

[30] Foreign Application Priority Data

Dec. 26, 1994 [JP] Japan .................................. 6-322190

[51] Int. Cl.$^6$ .................................................. H03M 7/00
[52] U.S. Cl. .................................. 341/50; 341/51; 341/82; 341/106
[58] Field of Search ........................ 341/50, 51, 87, 341/106, 107

[56] References Cited

U.S. PATENT DOCUMENTS

| | | | |
|---|---|---|---|
| 5,243,341 | 9/1993 | Seroussi et al. | 341/51 |
| 5,442,350 | 8/1995 | Iyer et al. | 341/51 |
| 5,455,576 | 10/1995 | Clark, II et al. | 341/50 |

OTHER PUBLICATIONS

Chang, D.K., Exact Data Compression Using Hierarchical Dictionaries, 1991 Data Compression Conference p. 431, Apr. 1991.

J. Ziv et al.; "Compression of Individual Sequences via Variable-Rate Coding"; IEEE Transactions on Information Theory, Vo. 1T-24 (1978); pp. 530-536.

*Primary Examiner*—Jeffrey A. Gaffin
*Assistant Examiner*—Jason H. Vick
*Attorney, Agent, or Firm*—Whitham, Curtis, Whitham & McGinn

[57] ABSTRACT

A database record compression system compresses data with frequency priority. The system has a formal dictionary for storing compressed strings and entry numbers corresponding to the compressed strings. A temporary dictionary compresses and stores strings of the plurality of strings input from an input file which are not stored in the formal dictionary. The system initializes all entries of the temporary dictionary when a number of registrations in the temporary dictionary reaches a predetermined number of initializations. In the system, an occurred string is registered in the formal dictionary when a frequency of occurrence of the string at the temporary dictionary reaches a predetermined number of times.

19 Claims, 6 Drawing Sheets

FIG.1

| ENTRY | CH | UP | DOWN | LEFT | RIGHT | |
|---|---|---|---|---|---|---|
| 1 | A | 0 | 2 | 0 | 0 | A |
| 2 | B | 1 | 5 | 3 | 4 | AB |
| 3 | A | 1 | 0 | 0 | 0 | AA |
| 4 | C | 1 | 0 | 0 | 0 | AC |
| 5 | C | 2 | 0 | 0 | 0 | ABC |

| ENTRY | CH | CNT | CH | CNT | CH | CNT | | CH | CNT |
|---|---|---|---|---|---|---|---|---|---|
| 1 | D | 5 | E | 3 | F | 1 | | H | 1 |
| 2 | A | 3 | B | 4 | 0 | 0 | | 0 | 0 |
| | | | | | | | | | |

DATABASE RECORD COMPRESSION SYSTEM AND METHOD THEREFOR INCLUDING FIRST AND SECOND DICTIONARIES

BACKGROUND OF THE INVENTION

The present invention relates to a method and system for compressing database records, and more particularly, to a method and database record compression system for compressing data to be stored in a string dictionary so as to efficiently utilize a storage area of the dictionary.

U.S. Pat. No. 5,442,350 to Iyer et al., issued Aug. 15, 1995, discloses a compression scheme using a separate static compression dictionary. The dictionary is initialized in part when the dictionary does not have an efficient capacity. The dictionary provides a counter for each reference number of the dictionary to count frequencies of use of each reference number in coding or the like. The strings having a high frequency of occurrence, as shown by the count on the counter, are retained. Conversely, the strings having a low frequency of occurrence are discarded, thereby creating "free" (e.g., empty) spaces for registration. This conventional scheme is generally called a "static dictionary scheme", and can continue coding while effectively utilizing the results of learning because subsequent coding is resumed in a state where those strings having a high frequency of occurrence among the learned histories are left in the dictionary, and those strings having a high frequency of occurrence are already registered at the time when the coding is resumed.

In such conventional systems, however, there is a problem that, when a database with many data is compressed, the dictionary becomes full quickly so that initialization is necessary every time a new string is registered, to thereby produce a free space. In addition, there is also a problem that strings to be registered may not be sufficiently registered.

SUMMARY OF THE INVENTION

In view of the foregoing problems of the conventional systems and schemes, an object of the present invention is to efficiently utilize the capacity of a disk in which a database is stored.

Another object of the present invention is to efficiently utilize the area for storing a dictionary when string data is compressed and stored in the dictionary.

Still another object of the present invention is to provide a database record compression system which, when character strings in an input file are compressed, preferentially compresses strings having a high frequency of occurrence in the input file.

Yet another object of the present invention is to provide a database record compression system which is very efficient even when a database having a large amount of data is compressed.

In a database record compression system, according to one aspect of the present invention, a formal dictionary stores compressed strings and entry numbers corresponding to the strings and a temporary dictionary compresses and stores strings of the strings input from an input file which are not stored in the formal dictionary.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE PREFERRED EMBODIMENT

A database record compression system and scheme according to an embodiment of the present invention will now be described in detail.

Figure 1:
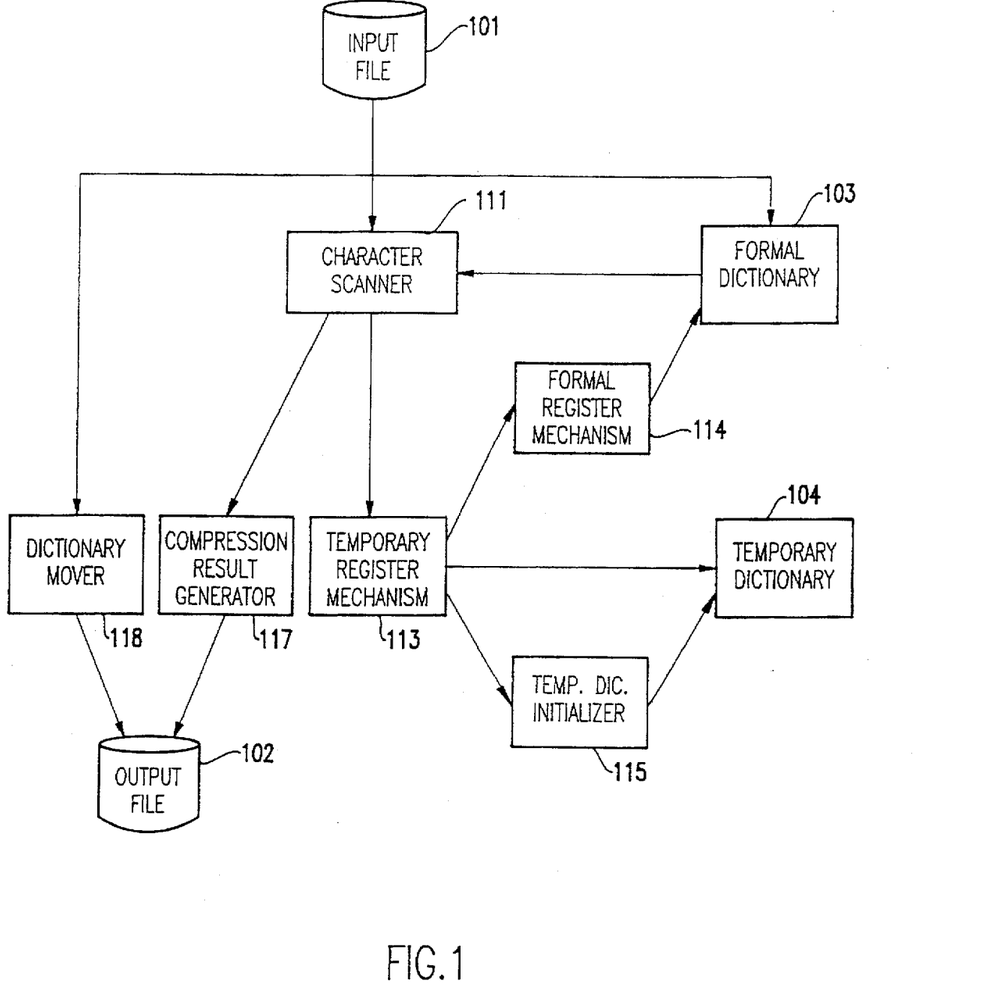
FIG. 1 is a block diagram showing the structure of an embodiment of the present invention.

Referring to FIG. 1, the database record compression system which is an embodiment of the present invention has an input file 101 having data to be compressed, and an output file 102 for storing the compressed data.

A formal dictionary 103 is provided for storing compressed strings and entry numbers corresponding to the strings.

A temporary dictionary 104 compresses and stores strings of the strings input from the input file 101 which are not stored in the formal dictionary 103.

String scanner 111 scans strings input from the input file 101 as byte strings. If extracted strings are registered in the formal dictionary 103, entry numbers corresponding to the strings are read.

Temporary register mechanism 113 registers "occurred strings" in the temporary dictionary 104 if they are not registered in the formal dictionary 103. For purposes of this application, "occurred strings" are defined as those stored in the temporary dictionary but not in the formal dictionary 103.

Formal register mechanism 114 registers the frequencies of occurrence of strings of the strings registered in the temporary register mechanism 113, which reach a predetermined frequency in the formal dictionary 103.

Temporary dictionary initializer 115 initializes all entries in the temporary dictionary 104 when the number of registrations in the temporary dictionary 104 reaches the predetermined initialization number.

Compression result generator 117 outputs the entry numbers of the formal dictionary 103 read by the string scanner 111 to the output file 102.

Dictionary mover 118 outputs the formal dictionary 103 to the output file 102 when all strings in the input file 101 have been processed.

Figure 2:
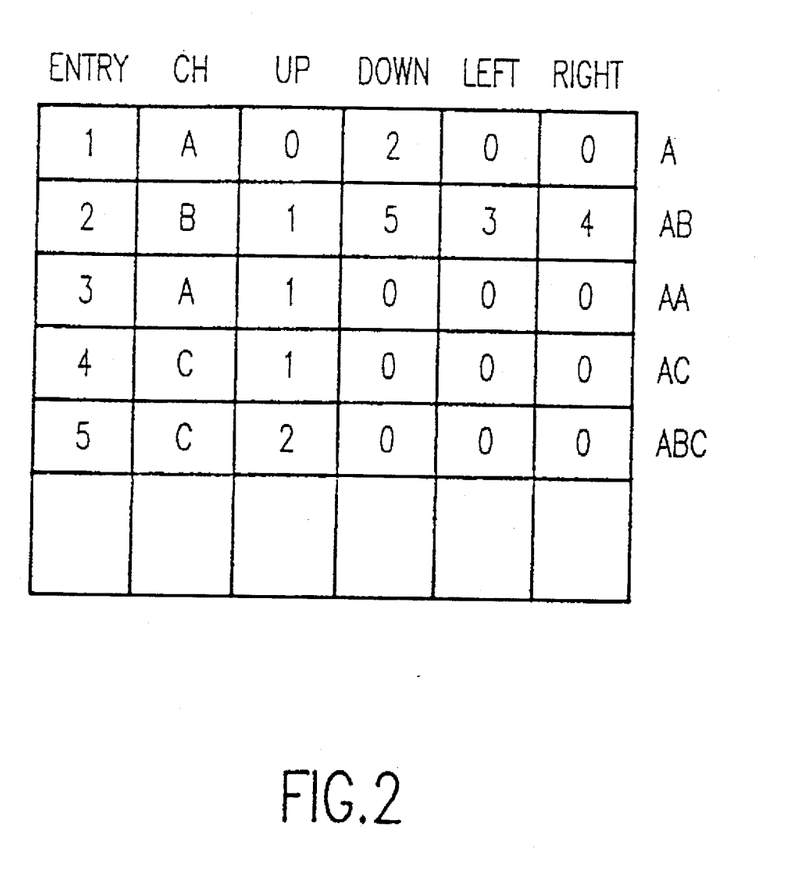
FIG. 2 illustrates contents of a formal dictionary 103 in the embodiment of the present invention.

Referring to FIG. 2, the formal dictionary 103 preferably has a two-dimensional structure, each row of which corresponds to one string registered in the formal dictionary. Each row corresponds to an entry which includes six elements. The six elements include an entry number (ENTRY), the last character of the registered string (CH), the entry number of the adjacent character (a "parent" entry) on an upper level (UP), the entry number of the next character (a "child" entry) on a lower level (DOWN), the entry number of a leftward entry located on a level lower than the "parent" entry by one (e.g., immediately below) and on the same level as the current entry, and which is an entry registering a character with a character code smaller than that of the last character (LEFT), and the entry number of a rightward entry located on a next lower level from the "parent" entry and on the same level as the current entry, and which is an entry registering a character with a character code larger than that of the last character (RIGHT). Each of the UP, DOWN, LEFT and RIGHT elements employs a hierarchical structure to allow high-speed reference to strings. Another entry on the same level can be referenced by following LEFT if it has a smaller character code, and by following RIGHT if it has a larger character code.

Figure 3:
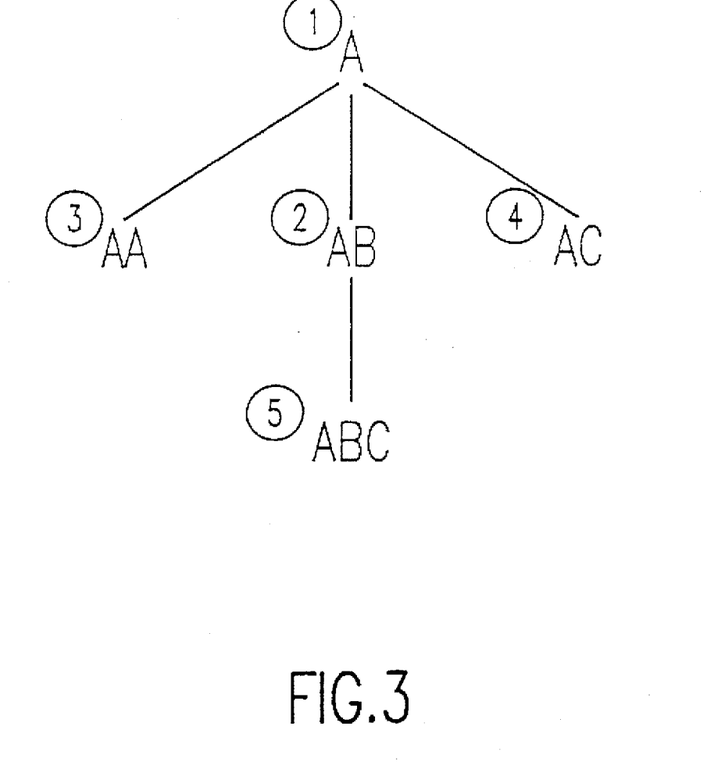
FIG. 3 is an example of entries in the formal dictionary 103 of FIG. 2.

For example, the characteristics of the entries of FIG. 2 are illustrated in FIG. 3. There are AA in the LEFT on the same level as AB, and AC in the RIGHT. The next lower level follows DOWN. For example, in the DOWN of A, there is AB representative of the lower levels. There is ABC on the level below AB. Conversely, there is A in the UP on levels AB, AA and AC, either of which are on a level immediately below A. With such a structure, there is no need to store the entire string. Only the last character need be stored as CH.

Figure 4:
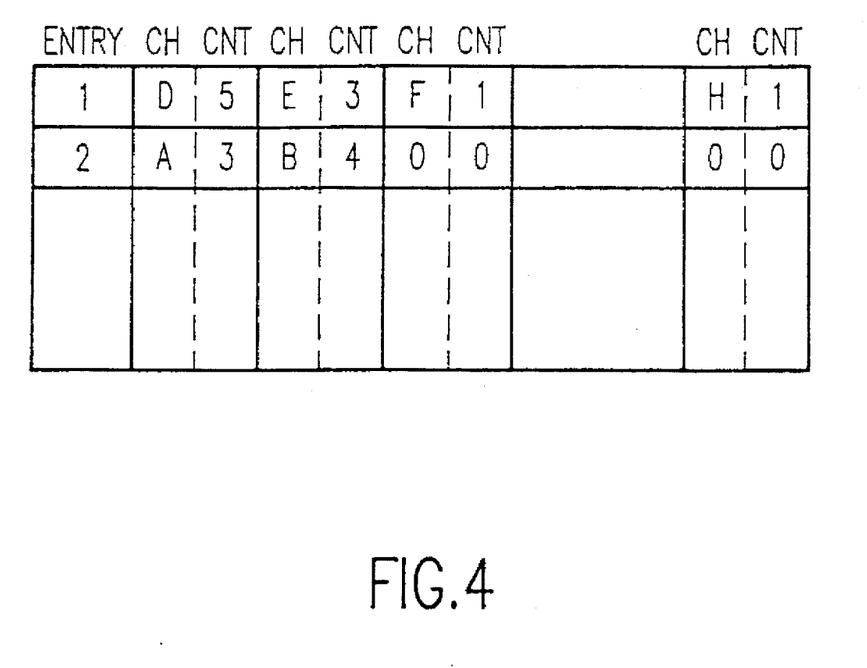
FIG. 4 illustrates contents of a temporary dictionary 104 in the embodiment of the present invention.

Referring to FIG. 4, the temporary dictionary 104 has a two-dimensional structure, each entry of which corresponds to that of the formal dictionary 103. Each entry includes the entry number (ENTRY) corresponding to the formal dictionary 103, and a plurality of sets of data having the last character (CH), which is connected to the last character of the corresponding entry of the formal dictionary 103 to represent a string and which is registered, and the frequency of occurrence (CNT) of the string in the input file 101. CH indicates that the CH (e.g., the last character) of the temporary dictionary 104 is added to the CH of a corresponding entry in the formal dictionary 103 to form a string. CNT indicates the number of times that this string has occurred.

If all sets are filled when a new string is temporarily registered in each entry, the string is registered by initializing the entry having the lowest occurrence frequency.

The structure and scheme according to the embodiment of the present invention are arranged to register a string by initializing an entry having a frequency of occurrence of one (e.g., "1"). Therefore, a new registration is not performed if all entries have an occurrence frequency of at least two (e.g., "2"). Of course, initialization of an entry having an occurrence frequency other than "1" could also be performed according to the designer's needs and system requirements.

Referring to FIGS. 1–5, the operation of the database record compression system will be described below.

The string scanner 111 first initializes a region in which an "occurred" string is stored (step 11 of FIG. 5), and determines whether the input file 101 contains an uncompressed string (step 12). Specifically, in step 11 the region is initialized for characters and in step 12 it is determined whether a character remains.

Figure 5:
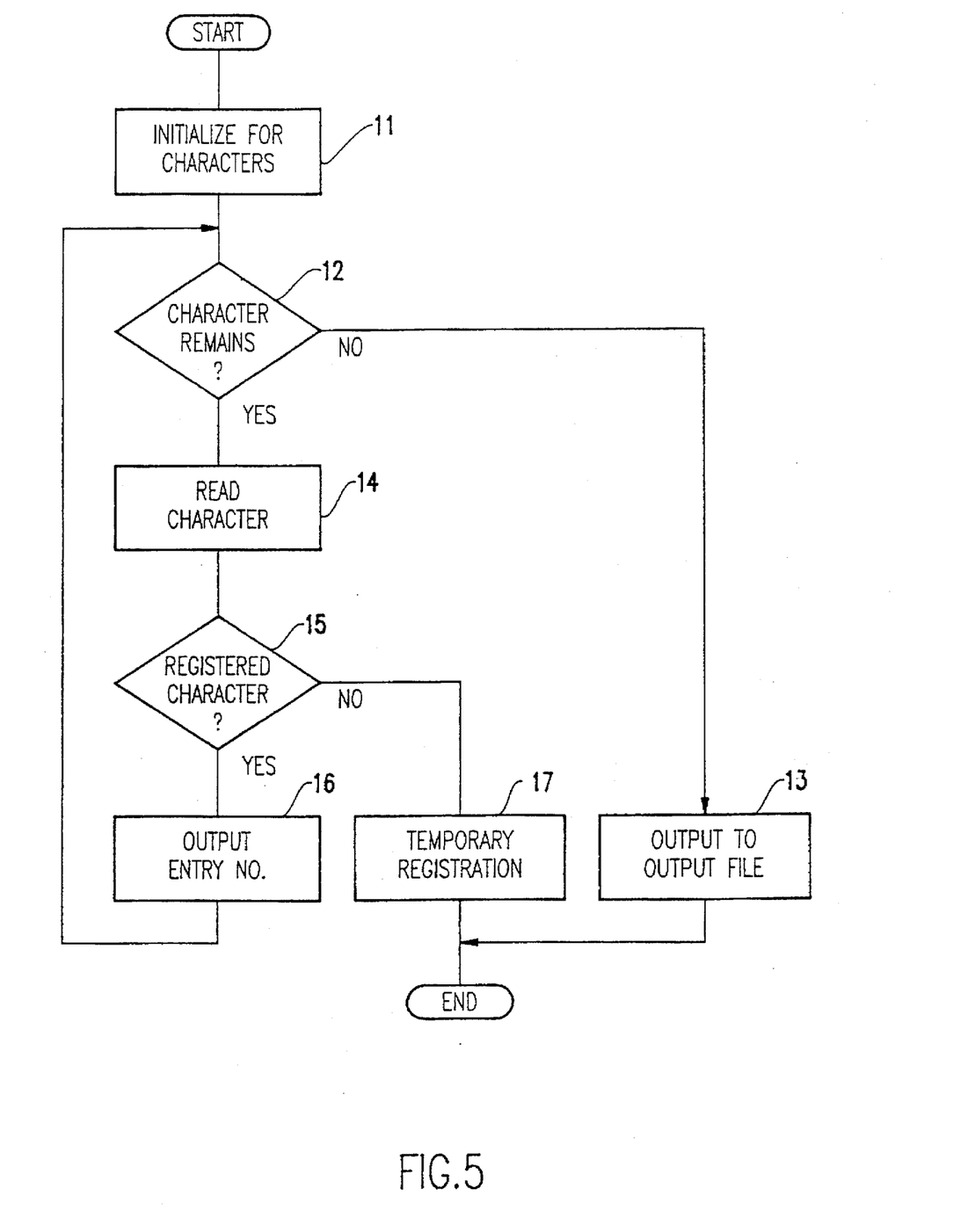
FIG. 5 is a flowchart illustrating the process of a character scanner 111 in the embodiment of the present invention.

If it is determined in step 12 that the input file 101 contains an uncompressed string (e.g., that a character remains), then the string scanner 111 reads the uncompressed string (e.g., character) from the input file 101 to treat it as an "occurred" string (step 14).

Then, the string scanner 111 determines whether the occurred string (e.g., character) is registered in the formal dictionary 103 (step 15).

In the determination process in step 15, the string scanner 111 compares the occurred string with each CH registered in the formal dictionary 103 character-by-character. If the occurred string is a string of "ABD," for example, it is found by searching the formal dictionary 103 in FIG. 2 and by finding that the first character "A" of "ABD" exists in ENTRY 1, the second character "B" exists in ENTRY 2 because the DOWN element of "A" points to ENTRY 2 and the CH of ENTRY 2 is "B" However, an entry pointing to the third character "D" of "ABD" does not exist in the formal dictionary 103 because the DOWN of "B" points to ENTRY 5, the CH of ENTRY 5 is "C," and the LEFT and RIGHT are not defined. That is, the occurred string "ABD" is not registered in the formal dictionary 103.

When the occurred string (character) is determined in step 15 to be not registered in the formal dictionary 103, the string scanner 111 outputs the occurred string. Conversely, if the occurred string is registered in the formal dictionary 103, the occurred string is output up to intermediate portion (e.g., up to position 2, 3 or 4 as shown in FIG. 3), the ENTRY corresponding to the last character CH registered in the formal dictionary 103 is output to the temporary register mechanism 113 (step 17).

According to the above example, if the occurred string is "ABD," in step 17, the string scanner 111 outputs the occurred string "ABD" to the temporary register mechanism 113. Since up to the second character "B" of the occurred string "ABD" is registered in the formal dictionary 103, ENTRY "2" of the entry corresponding to CH "B" of the second character is output.

When the occurred string is determined in step 15 to be registered in the formal dictionary 103, the string scanner 111 takes out the ENTRY number of the entry corresponding to the occurred string from the formal dictionary 103, outputs the ENTRY number to the compression result generator 117 (step 16), and the process returns to step 12 for further processing.

The compression result output generator 117 registers the entry number, output by the string scanner 111, in the output file 102.

Figure 6:
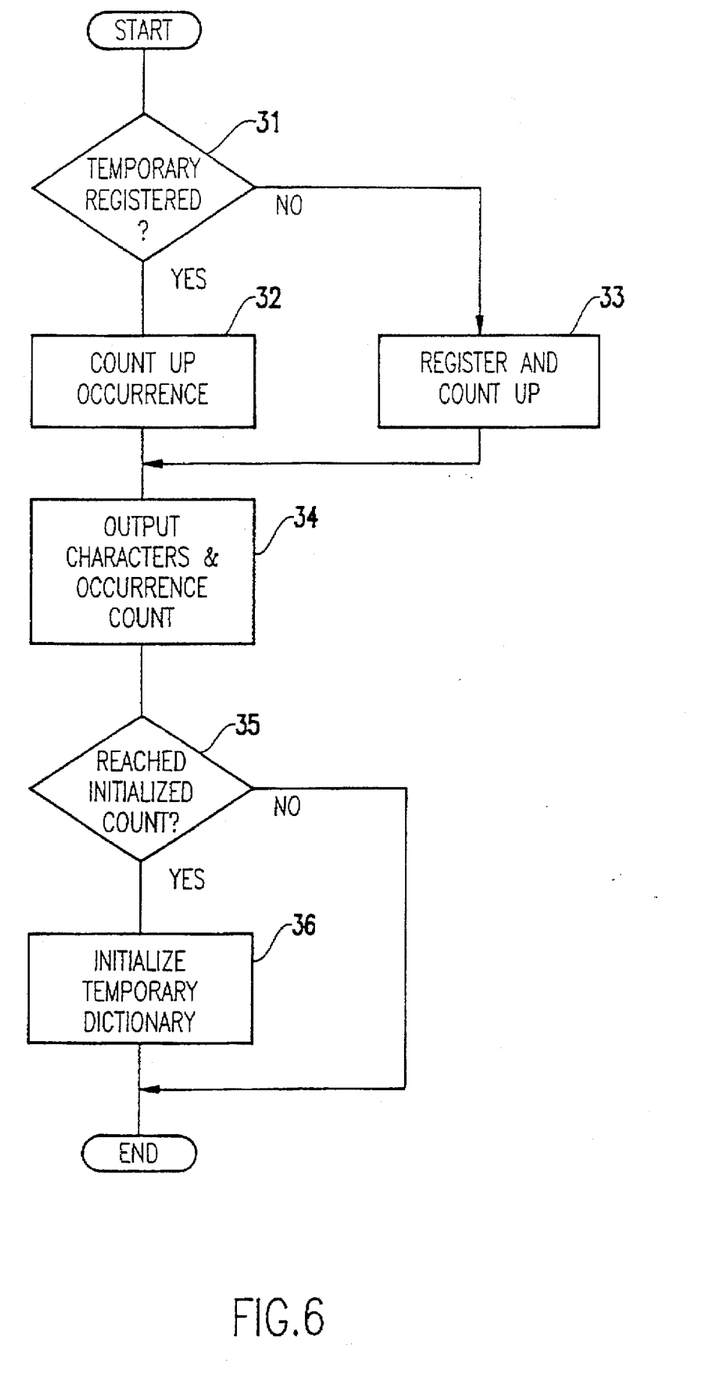
FIG. 6 is a flowchart illustrating the process of a temporary register mechanism in the embodiment of the present invention.

Referring to FIG. 6, a detailed flow of the temporary register mechanism 113 is described herein below. The temporary register mechanism 113 first determines whether the occurred string passed by the string scanner 111 is registered in the temporary dictionary 104 (e.g., see step 31).

The temporary register mechanism 113 determines in step 31, according to the above example, whether the third character "D" of the occurred string 112 "ABD" is registered in ENTRY "2" of the temporary dictionary 104 from the occurred string 112 "ABD" and ENTRY "2" is output from the string scanner 111. In the temporary dictionary 104 of FIG. 4, the CH "D" is not registered.

If the temporary register mechanism 113 determines in step 31 that the occurred string is registered in the temporary dictionary 104, it increments (e.g., adds "1" to) the frequency of occurrence of the entry corresponding to the occurred string in the temporary dictionary 104 (step 32).

If the temporary register mechanism 113 determines in step 31 that the occurred string is not registered in the temporary dictionary 104, it registers the occurred string in the temporary dictionary 104, and increments (e.g., adds "1" to) the frequency of occurrence of the entry (step 33).

According to the above example, in step 33, the temporary register mechanism 113 registers CH "D" and CNT "1" in the region next to CH "B" of ENTRY "2" in the temporary dictionary 104.

The temporary register mechanism 113 outputs the registered occurred string and its occurrence frequency to the formal register mechanism 114 after step 32 or step 33 have been completed (step 34).

Then, the temporary register mechanism 113 determines whether the number of registrations in the temporary dictionary 104 has reached a predetermined number of initializations (step 35). The predetermined number of initializations is the upper limit of the number of registrations able to be stored in the temporary dictionary 104 and is determined by the designer during initial system set-up and design according to the designer's constraints and requirements.

If the temporary register mechanism 113 determines in step 35 that the number of registrations in the temporary dictionary 104 has reached the predetermined initialization number (e.g., count), it starts the temporary dictionary initializer 115 (step 36).

The temporary dictionary initializer 115 clears characters and the occurrence frequency in all entries in the temporary dictionary 104.

The temporary dictionary initializer 115 may be arranged to increment (e.g., add "1" to) the setting value of the initialization number every time it performs initialization. In such a case, even strings having a lower occurrence frequency are not initialized, but instead are maintained in the temporary dictionary 104 so that their chances of registration in the formal dictionary 103 are increased.

In the embodiment according to the present invention, occurred strings still existing in the temporary dictionary 104 even when the initialization number, which is the upper limit of the number of registrations in the temporary dictionary 104, is reached, may be determined to have low frequencies of occurrence, and yet the temporary dictionary initializer 115 initializes characters and the frequency of occurrence in all entries in the temporary dictionary 104. However, the invention may be practiced such that, when the occurred string output to the formal register mechanism 114 in step 34 is registered in the formal dictionary 103, an entry corresponding to the occurred string is deleted from the temporary dictionary 104 by the temporary dictionary initializer 115. Thus, the temporary dictionary initializer 115 could be constructed to selectively delete one or more occurred strings according to the designer's preset criteria.

The formal register mechanism 114 compares the occurrence frequency output from the temporary register mechanism 113 with a predetermined number of times necessary for registering the occurred string in the formal dictionary 103. The formal register mechanism 114 registers the occurred string in the formal dictionary 103 when the occurrence frequency reaches the predetermined number of registrations.

According to the above example, the formal register mechanism 114 sets "6" to the RIGHT of ENTRY "5" because, in the formal dictionary 103 of FIG. 2, the occurred string 112 "ABD" does not have LEFT or RIGHT in CH "C" of ENTRY "5" pointed by DOWN "5" of CH "B" in ENTRY "2" pointed by DOWN "2" of CH "A" in ENTRY "1," and registers the entries for ENTRY "6," CH "D" and UP "2" in the formal dictionary 103.

The formal register mechanism 114 may be constructed to add one (e.g., "1") to the setting value of the registration number in the formal dictionary 103 every time it registers the occurred string in the formal dictionary 103. In addition, the number of formally registered strings may be controlled, and the setting value of the registration number in the formal dictionary 103 may be incremented every time the number exceeds a plurality of preset predefined values. When the setting of the number of registrations in the formal dictionary 103 is incremented, it becomes difficult to register the occurred string in the formal dictionary 103 so that the amount of data can be suppressed in the output file 102 in which ultimately compressed strings are stored.

When the string scanner 111 determines in step 12 of FIG. 5 that there are no more uncompressed strings in the input file 101, the contents of the formal dictionary 103 are output to the output file 102 by the dictionary mover 118 (step 13 of FIG. 5).

Thus, the database record compression system of the embodiment of the present invention completes its processing.

The database record compression system of the present invention is advantageous in that, when string data in an input file is compressed, the strings having a high occurrence frequency in the input file can be preferentially compressed.

Moreover, the database record compression system according to the present invention can preferentially compress strings with high occurrence frequency in an input file when string data in the input file is compressed so that the storage area of a dictionary can be efficiently utilized when the string data are stored in the dictionary.

In addition, with the invention, even when a database having a large amount of data is compressed, the compression operation can be efficiently performed so that the area of the disk storing the database can be efficiently utilized and minimized.

While the invention has been described in terms of a single preferred embodiment, those skilled in the art will recognize that the invention can be practiced with modification within the spirit and scope of the appended claims.

For example, while the invention has been described as being implemented in terms of software, the invention could also easily be implemented by hardware or hardware and software.

What is claimed is:

1. A database record compression system for use with an input file for inputting a plurality of strings, comprising:
   a first dictionary for storing a plurality of compressed strings and entry numbers corresponding to the compressed strings; and
   a second dictionary for compressing and storing strings of the plurality of strings input from said input file which are not stored in said first dictionary,
   wherein said first dictionary comprises a formal dictionary and said second dictionary comprises a temporary dictionary, at least one entry of said temporary dictionary being initialized when a number of registrations in said temporary dictionary reaches a predetermined number of initializations.

2. A database record compression system for use with an input file for inputting a plurality of strings, comprising:
   a first dictionary for storing a plurality of compressed strings and entry numbers corresponding to the compressed strings; and
   a second dictionary for compressing and storing strings of the plurality of strings input from said input file which are not stored in said first dictionary,
   wherein said first dictionary comprises a formal dictionary and said second dictionary comprises a temporary dictionary, all entries of said temporary dictionary being initialized when a number of registrations in said temporary dictionary reaches a predetermined number of initializations.

3. The database record compression system as claimed in claim 2, wherein an occurred string is registered in said formal dictionary when a frequency of occurrence of said occurred string in said temporary dictionary reaches a predetermined number of times.

4. A database record compression system which compresses record data, said record data including a plurality of strings, said system comprising:
- an input file for storing record data to be compressed;
- an output file for storing compressed record data;
- a first dictionary, coupled to said input file, for storing compressed strings and entry numbers corresponding to the compressed strings;
- a second dictionary for storing compressed strings which are not stored in said first dictionary;
- registration controlling means for scanning a record data from said input file, and registering the record data to one of said first dictionary and said second dictionary; and
- output means for outputting compressed record data to said output file.

5. The database record compression system as claimed in claim 4, wherein said first dictionary comprises a formal dictionary and said second dictionary comprises a temporary dictionary,
- said registration controlling means including a temporary dictionary initializer for initializing at least one entry of said temporary dictionary when a number of registrations in said temporary dictionary reaches a predetermined number of initializations.

6. The database record compression system as claimed in claim 5, wherein said temporary dictionary initializer increments the predetermined number of initializations.

7. The database record compression system as claimed in claim 5, wherein said output means includes a dictionary mover for outputting contents of said formal dictionary after all data in said input file are processed.

8. The database record compression system as claimed in claim 5, wherein said registration controlling means further includes formal registration means for registering an occurred string in said formal dictionary when a frequency of occurrence at said temporary dictionary reaches a predetermined number of times.

9. The database record compression system as claimed in claim 8, wherein said temporary dictionary initializer deletes a corresponding entry of said temporary dictionary when said formal registration means registers the occurred string.

10. The database record compression system as claimed in claim 8, wherein said formal registration means increments the predetermined number of times when said formal registration means registers the occurred string.

11. The database record compression system as claimed in claim 4, wherein said first dictionary comprises a formal dictionary and said second dictionary comprises a temporary dictionary,
- said registration controlling means including formal registration means for registering an occurred string in said formal dictionary when a frequency of occurrence at said temporary dictionary reaches a predetermined number of times.

12. The database record compression system as claimed in claim 4, wherein said first dictionary comprises a formal dictionary and said second dictionary comprises a temporary dictionary,
- said registration controlling means including a character scanner for scanning record data from said input file as byte strings.

13. The database record compression system as claimed in claim 12, wherein said registration controlling means includes a temporary registration means for registering an occurred string in said temporary dictionary.

14. The database record compression system as claimed in claim 12, wherein said output means includes a compression result generator for outputting an entry number from said character scanner.

15. A method of compressing a database record for use with a database record compression system having an input file for storing record data to be compressed, an output file for storing compressed record data, a first dictionary for storing a plurality of compressed strings and entry numbers corresponding to the compressed strings, and a second dictionary for storing compressed strings which are not stored in said first dictionary, comprising:
- a step of scanning record data having strings output from said input file;
- a step of registering the strings in said second dictionary;
- a step of initializing at least one entry of said second dictionary when a number of registrations in said second dictionary reaches a predetermined number of initializations;
- a step of registering an occurred string in said first dictionary when a frequency of occurrence at said second dictionary reaches a predetermined number of times; and
- a step of outputting compressed strings to said output file.

16. The method of compressing a database record as claimed in claim 15, wherein said first dictionary comprises a formal dictionary and said second dictionary comprises a temporary dictionary,
- said initializing step includes a step of incrementing the predetermined number of initializations.

17. The method of compressing a database record as claimed in claim 15, wherein said first dictionary comprises a formal dictionary and said second dictionary comprises a temporary dictionary,
- said initializing step includes a step of deleting a corresponding entry of said temporary dictionary when said occurred string is registered in said first dictionary.

18. The method of compressing a database record as claimed in claim 15, wherein said first dictionary comprises a formal dictionary and said second dictionary comprises a temporary dictionary,
- said step of registering the occurred string in said first dictionary includes a step of incrementing the predetermined number of times when said occurred string is registered in said first dictionary.

19. The method of compressing a database record as claimed in claim 15, wherein said first dictionary comprises a formal dictionary and said second dictionary comprises a temporary dictionary,
- said outputting step includes a step of outputting an entry number.

* * * * *